(12) United States Patent
Hart et al.

(10) Patent No.: US 6,453,248 B1
(45) Date of Patent: Sep. 17, 2002

(54) HIGH IMPEDANCE FAULT DETECTION

(75) Inventors: David G. Hart, Raleigh; Damir Novosel, Cary, both of NC (US); Steven A. Kunsman, Allentown, PA (US)

(73) Assignee: ABB Inc., Raleigh, NC (US)

(*) Notice: Subject to any disclaimer, the term of this patent is extended or adjusted under 35 U.S.C. 154(b) by 0 days.

(21) Appl. No.: 09/119,792

(22) Filed: Jul. 21, 1998

(51) Int. Cl.$^7$ .......................... G01R 31/00; G06F 19/00
(52) U.S. Cl. .............................. 702/58; 702/59; 361/42; 324/509; 324/525
(58) Field of Search ................ 702/57–61, 66, 702/117, 182–185, 188; 361/42, 62, 63, 78, 79; 324/509, 522, 525, 539, 541, 543, 544; 714/14

(56) References Cited

U.S. PATENT DOCUMENTS

| | | | | |
|---|---|---|---|---|
| 4,297,738 A | * | 10/1981 | Lee | 361/42 |
| 4,357,644 A | * | 11/1982 | Schmidt | 361/76 |
| 4,600,961 A | * | 7/1986 | Bishop | 361/76 |
| 4,766,549 A | * | 8/1988 | Schweiter, III et al. | 702/59 |
| 4,871,971 A | * | 10/1989 | Jeerings et al. | 324/509 |
| 4,878,142 A | * | 10/1989 | Bergman et al. | 361/80 |
| 4,922,368 A | * | 5/1990 | Johns | 361/62 |
| 5,485,093 A | * | 1/1996 | Russell et al. | 324/522 |
| 5,506,789 A | * | 4/1996 | Russell et al. | 702/58 |
| 5,550,751 A | * | 8/1996 | Russell et al. | 700/293 |
| 5,805,458 A | * | 9/1998 | McNamara et al. | 702/60 |
| 5,895,988 A | * | 4/1999 | Shaffer et al. | 307/126 |
| 6,259,972 B1 | * | 7/2001 | Sumic et al. | 700/286 |

FOREIGN PATENT DOCUMENTS

GB        2012505 A    *    7/1979

OTHER PUBLICATIONS

Westrom et al. Open Conductor Detector System. Jul. 1992. IEEE Transactions on Power Delivery, vol. 7, No. 3. pp. 1643–1650.*
Patterson, Ron. Signatures and Software Find High–Impedance Faults. Jul. 1995. IEEE Computer Applications in Power. vol. 8, No. 3. pp. 12–15.*
Wester, Craig. High Impedance Fault Detection on Distribution Systems. Apr. 26–28, 1998. Rural Electric Power Conference, 1998. pp. C5–1–C5–5.*

* cited by examiner

Primary Examiner—Marc S. Hoff
Assistant Examiner—Manuel L. Barbee
(74) Attorney, Agent, or Firm—Woodcock Washburn LLP

(57) ABSTRACT

An improved high impedance fault (HIF) detection system comprises an analyzer located at a circuit breaker or substation with feeders, wherein the analyzer analyzes current and/or voltage waveforms to detect a HIF on the feeder or on one of a plurality of laterals coupled to the feeder; a plurality of remote outage detectors located respectively at corresponding customer sites, each remote outage detector including a mechanism to detect a loss of potential or power at the corresponding site; and a computer in communication with the analyzer and the remote outage detectors.

15 Claims, 2 Drawing Sheets

HIGH IMPEDANCE FAULT DETECTION

FIELD OF THE INVENTION

The present invention relates generally to methods and apparatus for detecting faults on electrical transmission and distribution lines, and more particularly to a system for detecting high impedance faults.

BACKGROUND OF THE INVENTION

A high impedance fault (HIF) may be defined as a fault that occurs when a downed or otherwise faulted conductor fails to draw enough current to operate a conventional protective relay. Conventional relays must be set above the maximum load current and above any cold load pickup condition that might occur. This degrades the reliability since faults near or below these values cannot be detected. However, since a down conductor on a distribution feeder is primarily a safety issue, an approach that is different from that used for overcurrent protection is required.

Implementation of a HIF detector for feeder tripping may increase outages and create new hazards (e.g., de-energizing traffic signals). Detecting these faults is very difficult since various loads and normal distribution activities (such as capacitor switching) may generate transients that must be distinguished from a fault condition. Detection is further complicated since HIFs are sporadic in nature. For example, when a broken conductor falls on the ground, it may intermittently conduct current. In some cases, the HIF may draw very little if any current. Despite these difficulties, since public safety is a top priority for utilities, there has been a long felt need to solve this problem. Recently, General Electric, Nordon Technologies, and The Kearny Company have developed products to detect HIFs on a feeder.

The GE Digital Fault Monitor (DFM) attempts to distinguish a fault from normal activities. The frequencies and energy present in the signal are inputs to an intelligent system that determines the presence of arcing on the feeder. In addition, RMS and 60 Hz analyses are used to determine the presence of a HIF. The multiple requirements of this scheme are deemed necessary, since some utilities have indicated that a false trip is less desirable than an undetected HIF.

The High Impedance Fault Alarm System (HIFAS) is a relay developed by Nordon Technologies and is commercially available. Rather than examine various frequencies caused by a HIF, the HIFAS relay employs characteristics of the third harmonic. Basically, Nordon Technologies asserts that the third harmonic due to a HIF is 180 degrees out of phase with the fundamental voltage at the fault location. By monitoring the third harmonic and determining the change in the third harmonic from steady state values, the HIFAS identifies a high impedance fault.

Another approach to HIF detection has been proposed by The Kearny Company. Rather than analyze the signal distortions caused by the HIF, the loss of potential is used. The Open Conductor Detector System (OCDS) utilizes a transmitter on the 120 VAC side of a distribution transformer. Loss of voltage on the line causes the transmitter to emit a specified frequency on the system neutral. Reception of the signal at the substation indicates a broken conductor. Since the transducer may act following a blown fuse on the distribution transformer, the use of two transmitters is recommended for redundancy, which may be too expensive for many applications. Thus, an open conductor is only determined if the receiver acknowledges two frequencies (one distinct frequency per transmitter).

Shortcomings of the above-described approaches include: With respect to the Nordon approach, noisy loads may interfere with the operation of the system. The Kearny approach would place radio transmitters at the fuses and houses at which a loss of potential is to be detected. This is believed to be prohibitively expensive. Finally, the GE approach is not deemed to be sufficiently reliable.

SUMMARY OF THE INVENTION

A primary goal of the present invention is to provide an improved HIF detection system. Such a system in accordance with the present invention comprises the following elements:

- an analyzer located at a circuit breaker or substation with feeders, wherein the analyzer includes means for analyzing current and/or voltage waveforms to detect a HIF on the feeder or on one of a plurality of laterals coupled to the feeder;
- a plurality of remote outage detectors located respectively at corresponding customer sites, each remote outage detector including a mechanism to detect a loss of potential or power at the corresponding site; and
- a computer in communication with the analyzer and the remote outage detectors.

Other features of the present invention are disclosed below.

DETAILED DESCRIPTION OF PREFERRED EMBODIMENTS

Figure 1:
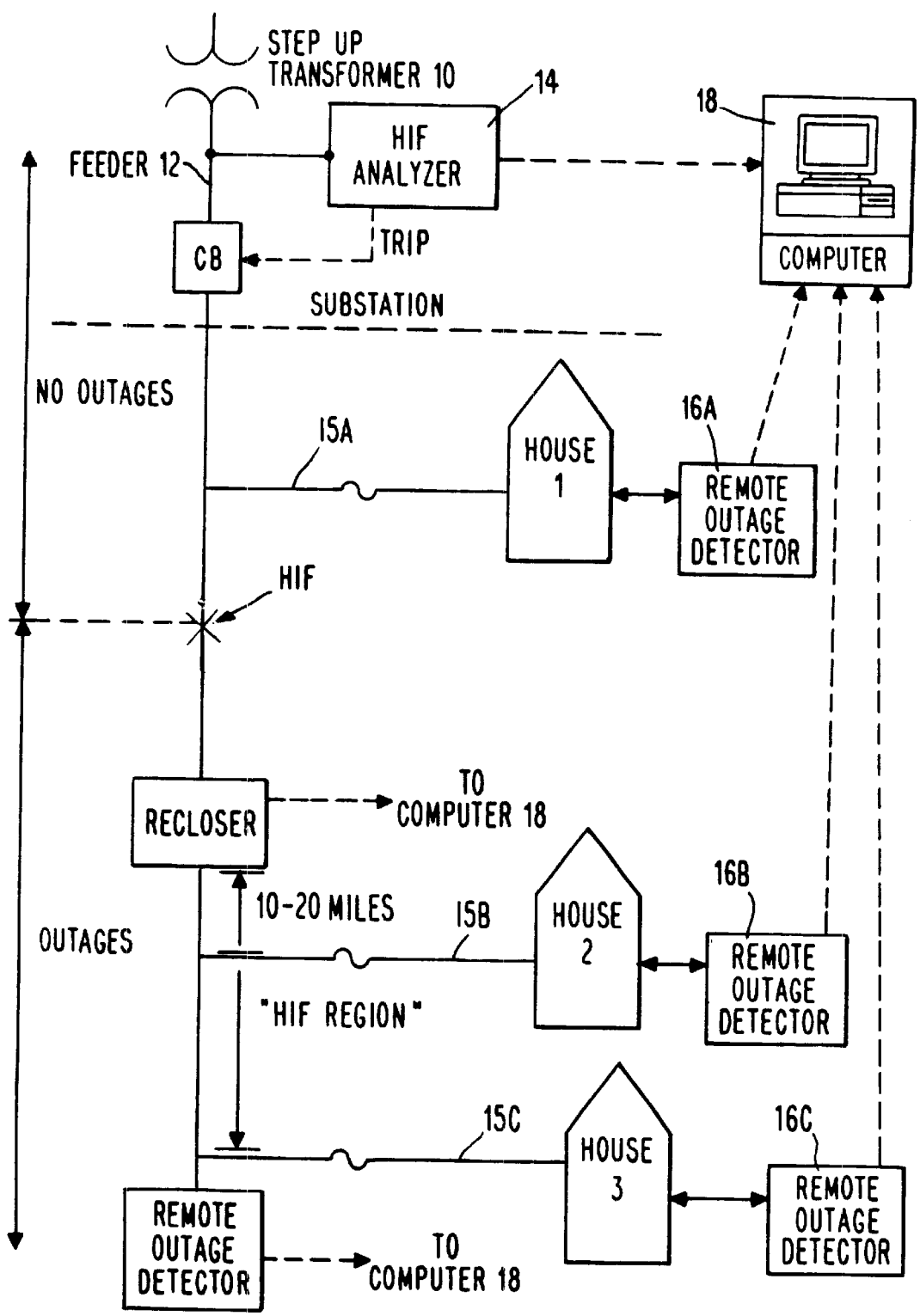
FIG. 1 schematically depicts a presently preferred embodiment of a HIF detection system in accordance with the present invention.

Detection of high impedance faults is a complex problem that cannot be described with an accurate mathematical model. Several options exist for future product development. One option is the use of a single detection device at the substation. This approach has the benefits of not requiring communications, thus being less expensive. The detection device would analyze the signal at the substation and distinguish characteristics unique to a HIF. Quantities that could be studied include harmonic analysis, variation in magnitude (60 Hz, RMS, harmonics), and the energy content of the signal.

Another approach is to use communications to solve the HIF detection problem. The use of remote sensors to positively distinguish HIFs from a blown fuse or other event is possible. This would require inexpensive communications and sensors.

A logical compromise is a hybrid system including a device at the substation with some remote sensors. As shown in the attached drawing, a presently preferred embodiment of a HIF detection system comprises a signal analysis device at the substation in combination with a plurality of remote sensors in communication with the signal analysis device.

As shown in the drawing, the inventive system is associated with a power system including a transformer 10, a feeder 12, and laterals 15A, 15B, 15C, etc. A recloser and a circuit breaker (CB) are also included in the power system, as are fuses that protect the customer "houses". The present invention provides an HIF detection system comprising an analyzer 14 coupled at a substation to the feeder, and a plurality of remote outage detectors 16A, 16B and 16C coupled to selected houses on laterals 15A, 15B and 15C, respectively. In addition, a computer 18 is employed to process the data provided by the analyzer 14 and remote outage detectors 16A, 16B, 16C. The analyzer 14 could be of the type described below or of the type used in the above-described prior art, and the computer 18 could be of the type used in the ABB Power T&D Company's CADOPS system.

Figure 2:
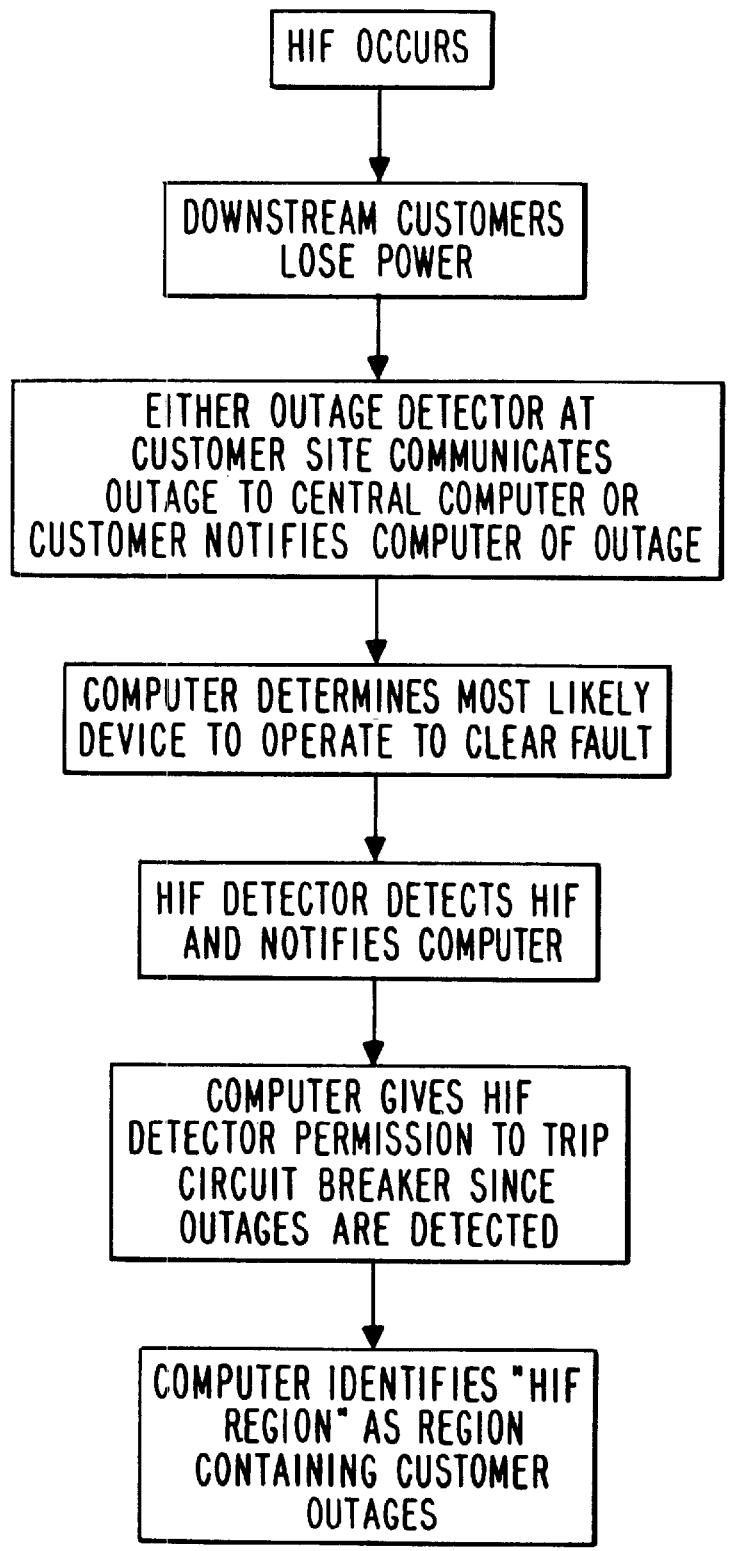
FIG. 2 is a flowchart of a method in accordance with the present invention.

An exemplary flowchart showing the operation of the system is provided in FIG. 2. As shown, the following sequence of events may occur. First, an HIF occurs somewhere in the protected power system. This could be, e.g., at the location "X" in FIG. 1. When the HIF occurs, one or more downstream customers may lose power or potential. Next, in accordance with the present invention, either an outage detector at a customer site reports an outage to the computer 18, or a customer may report the outage by telephone. The computer then determines the most likely device to operate to clear the fault. The "most likely device" may be, e.g., the substation circuit breaker (CB) shown in FIG. 1. As shown in FIG. 2, the HIF detector 14 may also detect the HIF and report such detection to the computer 18. Since outages have been detected, the computer "authorizes" the HIF analyzer 14 to trip the circuit breaker. Finally, the computer identifies an "HIF Region" containing the customer sites at which an outage was detected. For example, if only "House 2" in FIG. 1 experienced an outage, then the "HIF Region would contain House 2 but not "House 1" or "House 3".

Substation Device

The device at the substation can analyze current and/or voltage waveforms to detect a HIF. One example of such a device examines the variation of the current waveforms over a short period and a long period. The short period analysis is affected by arcing during that particular cycle. The arcing will inject other frequencies into the system. Further, the magnitude and width of the arcing current can vary due to the random nature of the arc impedance, and so the frequencies can be expected to vary randomly. Therefore, the long period will be dominated by the randomness of the arcing. Analysis of the current and/or voltage waveforms can be expected to yield:

1. $\Delta I_1 = \Delta I_0 = \Delta I_2$ for the injected harmonics. (Note that the symbols $\Delta I_1$, $\Delta I_0$, and $\Delta I_2$ refer to the difference between faulted and pre-fault values of the positive, zero and negative sequence currents, respectively.) The actual calculation can be performed for several harmonics, either those which show the most change or above a threshold, or both. This can be computed on a cycle basis.

2. On cycles that exhibit arc detection, the magnitude of the waveform or the composite frequencies can be compared for the positive and negative half cycles of the fundamental frequency. During arcing, a statistical pattern of randomness can emerge that will provide an indication of a HIF. Though computed for a short period (per cycle), the variance of the magnitude of the arcing cycles over a long period may indicate a HIF. If harmonics are used, a pattern of randomness of the magnitude and angle can be examined. This is determined each cycle and analyzed over a long period.

3. Calculation of the fundamental current quantities. A HIF is usually preceded by a lightning flash or other temporary fault. Calculation of the fundamental current values can be used to determine the likelihood of a three-phase, line-to-line, double-line-to-ground, or single-line-to ground fault. A drop in current on all three phases can also be used to indicate a reclosing operation, which can precede reclosing a HIF, or the loss of load due to the conductor breaking after the temporary fault. This information should be determined on a per cycle basis.

4. If voltage data is available, the direction of the fault can be determined using the impedance determined by each harmonic. Calculation of these values on cycles where arcing occurs (harmonics or energy indicate arcing) should indicate whether the HIF is on the feeder or behind the transformer. The impedances can be used to determine an apparent impedance for each harmonic. The value should be consistent for each harmonic (resistance and inductance) and can be used to indicate a HIF. A possible technique would involve the determination of the apparent impedance for the different harmonics, comparing for consistency, and comparing values from other cycles where arcing may be present. A pattern of consistent values and nominal values can indicate periods of arcing and non-arcing. Whether or not there will be enough measurable change in the harmonic voltages should be determined from fault tests. This information should be determined each cycle and compared over the long term.

5. Calculation of the energy of the harmonics can be used to detect a HIF. A sudden change in harmonic energy or magnitude could indicate a HIF, switching, or additional loads (since a HIF can be expected to generate a continuous spectrum (sinc function) on a per cycle basis, the energy of the harmonics and selected other frequencies may be examined). Another approach is to sample the current waveforms and remove the harmonics with a digital filter. If the energy of the harmonics and the energy of the original sampled signal are compared, under normal operating conditions one would expect the difference to be minimal. However, during switching or a HIS, other frequencies that are not accounted for by just the harmonics should be present. Thus, the residual energy can be expected to increase. A short term increase can be used to detect an event. A long term increase or random variation may indicate a HIF.

The detection of a HIF should not be determined by any single one of these criteria, but by a logical progression of them. Thus, the pattern of single-line-to-ground fault, followed by loss of load, followed by increase of harmonic and residual energy, coupled with consistent impedance values may successfully indicate the presence of a HIF. The result must also be analyzed to determine an appropriate response. Due to the noted interest of the utilities in tripping only for faults where a conductor is on the ground, the loss of load factor can help to distinguish the case of a line against a tree or on the ground. Thus, the analysis and combining of these events is an important feature of the HIF detector.

The primary disadvantage of the single device scheme is that once a HIF is de-energize, it can be almost impossible to find the fault. The HIF detector can be used to alert repair crews to expedite the search for the downed conductor, but public safety is not immediately improved. Typically, when an outage occurs, the utility can expect to receive outage reports from most of the customers on the line, and quickly determine the region of the problem and clear the fault. For instance, the fault is likely to be on the main feeder if the entire region is without power, but may be on a lateral if a smaller region is without power. However, a HIF can be anywhere, and thus will be difficult to locate.

Another problem is that the HIF cannot be detected unless the fault draws sufficient current. No matter what algorithm is used at the substation, there will always be a current value below which the fault cannot be detected. For these reasons, remote devices are utilized throughout the distribution network.

Remote Devices and Communications

The present invention employs a limited number remote sensors placed at the load sites to indicate loss of power. The remote sensors need not be dedicated devices, but could implemented in a meter or other monitor at the site. Accordingly, the present invention provides a hybrid system involving the use of some remote devices in conjunction with a device at the substation. The remote sensors indicate loss of potential. Once loss of potential has been determined, the substation monitor determines whether a HIF, recloser, or fuse operation has occurred. Signal analysis at the substation and loss of potential can be used to trip a circuit breaker. Signal analysis with no remote loss of voltage indication can be used to issue an alarm only. This would allow for trip functions on lines where the public threat is more plausible (by placing a sensor on the line) and alarm functions for more isolated lines. Note that this significantly reduces the chances of the apparatus misoperating since, in addition to signal analysis, loss of potential must occur for the breaker to be tripped.

The protection on the main must be set at or above the maximum load of each lateral. Thus, a HIF has the least chance of being detected here. The minimal configuration possible for this implementation involves a voltage sensor at the end of the three phase main feeder. This can be used to securely determine the presence of a HIF on the main.

Note that the remote sensors would not have to be dedicated sensors.

Another option is the placement of intelligent devices throughout the network. For instance, if devices were placed on the laterals, they could substantially improve HIF detection. Loss of potential on one or two phases could indicate a HIF upstream. Loss of voltage on all phases would indicate fuse operation or breaker operation. At the lateral, the arcing phenomenon would be more predominant than at the substation. This should allow for easier detection and, more importantly, can allow the lateral with the HIF to be determined. These devices would require voltage and current data, processing power, and communications. A logical procedure would be for the device to detect a HIF and take corrective action if available, and/or notify the dispatcher of the situation, allowing him to determine the best response for present conditions.

The above description of preferred embodiments is not intended to limit the scope of protection of the following claims. Thus, for example, except where they are expressly so limited, the following claims are not limited to applications involving three-phase power systems. Moreover, the claims are not limited to fault detection or location systems associated with any particular section (i.e., transformer, feeder, high power transmission line, etc.) of a power distribution system. In addition, the remote outage detectors employed in the preferred embodiments described above could be omitted and the remote outage detection function could be performed by customers placing telephone calls the utility (e.g., a call center) to report a loss of power or potential.

We claim:

1. A method for detecting a high impedance fault (HIF) in an electrical distribution system including a substation providing power to a feeder and one or more laterals coupled to the feeder for providing power to customer sites coupled to the lateral(s), as well as a plurality of circuit breakers associated with the feeder, comprising:

receiving one or more reports of an outage at one or more customer sites, wherein the outage(s) may have been caused by a HIF;

receiving data from an analyzer located at the substation;

using a computer and the outage report(s) and analyzer data to determine at least one circuit breaker to operate to clear the HIF; and tripping the circuit breaker;

wherein the analyzer at the substation analyzes current and/or voltage waveforms to detect a HIF; and wherein the analyzer examines variation of the current waveforms over a short period and a long period.

2. A method as recited in claim 1, wherein analysis of the current and/or voltage waveforms includes an analysis of the difference between faulted and pre-fault values of the positive, zero and negative sequence currents.

3. A method as recited in claim 2, wherein the analysis is performed for several harmonics.

4. A method as recited in claim 1, wherein the analyzer at the substation detects a statistical pattern of randomness in the waveforms and uses this as an indication of a HIF.

5. A method as recited in claim 1, wherein the analyzer employs a calculation of fundamental current values to determine the likelihood of a three-phase, line-to-line, double-line-to-ground, or single-line-to-ground fault.

6. A method as recited in claim 1, wherein the analyzer determines the direction of the fault using impedance, whereby the analyzer determines whether the HIF is on the feeder or behind a substation transformer.

7. A method as recited in claim 1, wherein the analyzer calculates the energy of harmonics to detect the HIF.

8. A method as recited in claim 1, further comprising using the computer to identify a region containing one or more customer sites for which an outage has been reported.

9. A hybrid system for detecting a high impedance fault (HIF) in an electrical distribution system including a substation providing power to a feeder and one or more laterals coupled to the feeder for providing power to customer sites coupled to the lateral(s), as well as a plurality of circuit breakers associated with the feeder, comprising:

(a) an analyzer located at a substation, said analyzer comprising a processor for analyzing current and/or voltage waveforms to identify a possible HIF on a feeder or on one of a plurality of laterals coupled to said feeder;

(b) a plurality of remote outage detectors located respectively at corresponding customer sites, each said remote outage detector comprising means for detecting a loss of power at the corresponding site; and (c) a computer in communication with said analyzer and said remote outage detectors for processing information provided by said analyzer and remote outage detectors to confirm the presence of a HIF on said feeder or on at least one of said plurality of laterals;

wherein the analyzer at the substation analyzes current and/or voltage waveforms to detect a HIF; and wherein the analyzer examines variation of the current waveforms over a short period and a long period.

10. A system as recited in claim 9, wherein analysis of the current and/or voltage waveforms includes an analysis of the difference between faulted and pre-fault values of the positive, zero and negative sequence currents.

11. A system as recited in claim 10, wherein the analysis is performed for several harmonics.

12. A system as recited in claim 9, wherein the analyzer at the substation detects a statistical pattern of randomness in the waveforms and uses this as an indication of a HIF.

13. A system as recited in claim 9, wherein the analyzer employs a calculation of fundamental current values to determine the likelihood of a three-phase, line-to-line, double-line-to-ground, or single-line-to-ground fault.

14. A system as recited in claim 9, wherein the analyzer determines the direction of the fault using impedance, whereby the analyzer determines whether the HIF is on the feeder or behind a substation transformer.

15. A system as recited in claim 9, wherein the analyzer calculates the energy of harmonics to detect the HIF.

* * * * *

UNITED STATES PATENT AND TRADEMARK OFFICE
CERTIFICATE OF CORRECTION

PATENT NO. : 6,453,248 B1
DATED : September 17, 2002
INVENTOR(S) : David G. Hart et al.

It is certified that error appears in the above-identified patent and that said Letters Patent is hereby corrected as shown below:

Column 3,
Line 29, insert -- " -- after the word "Region";

Column 4,
Line 38, delete "HIS" and insert -- HIF -- therefor;
Line 57, delete "de-energize" and insert -- de-energized -- therefor.

Signed and Sealed this

Tenth Day of December, 2002

JAMES E. ROGAN
*Director of the United States Patent and Trademark Office*